United States Patent [19]

Baba

[11] Patent Number: 5,742,477
[45] Date of Patent: Apr. 21, 1998

[54] MULTI-CHIP MODULE

[75] Inventor: Mikio Baba, Tokyo, Japan

[73] Assignee: NEC Corporation, Tokyo, Japan

[21] Appl. No.: 676,722

[22] Filed: Jul. 8, 1996

[30] Foreign Application Priority Data

Jul. 6, 1995 [JP] Japan ................... 7-192670

[51] Int. Cl.$^6$ ........................................ H05K 7/20
[52] U.S. Cl. ................... 361/704; 257/686; 257/713; 361/690; 361/715; 361/735
[58] Field of Search ........................ 165/80.2, 80.3, 165/185; 174/16.3; 257/685, 686, 706–707, 712–713; 361/685–686, 690, 694–695, 704, 707, 709–710, 715–724, 735, 744, 760–764, 790, 807, 809

[56] References Cited

U.S. PATENT DOCUMENTS

| | | | |
|---|---|---|---|
| 5,065,277 | 11/1991 | Davidson | 257/686 |
| 5,567,983 | 10/1996 | Hirano et al. | 257/686 |
| 5,589,711 | 12/1996 | Sano et al. | 361/719 |

FOREIGN PATENT DOCUMENTS

| | | |
|---|---|---|
| 2-45653 | 3/1990 | Japan . |
| 3-64060 | 3/1991 | Japan . |
| 5048001 | 2/1993 | Japan .................. 257/668 |

*Primary Examiner*—Gregory D. Thompson
*Attorney, Agent, or Firm*—Young & Thompson

[57] ABSTRACT

A multi-chip module includes an insulating board, a semiconductor chip, a plurality of carriers, and semiconductor devices. The insulating board has a recess portion formed in a central portion of a lower surface. A wiring pattern is formed on the insulating board. The semiconductor chip is mounted in the recess portion in the insulating board. Each carrier is mounted on the upper surface of the insulating board and has a leg portion with a side-surface electrode formed on a side surface. The resin-sealed semiconductor devices are respectively mounted on the carriers. The resin-sealed semiconductor devices are mounted in a stacked state.

20 Claims, 6 Drawing Sheets

MULTI-CHIP MODULE

BACKGROUND OF THE INVENTION

1. Field of the Invention

The present invention relates to a multi-chip module and, more particularly, to a multi-chip module having a mounting structure which allows many electronic parts to be efficiently mounted.

2. Description of the Prior Art

A multi-chip module (to be referred to as an MCM hereinafter) is designed to mount a plurality of semiconductor chips in a single package. This scheme has received a Great deal of attention as a technique of allowing high-density mounting, and decreasing wiring lengths to realize a high-speed system.

FIG. 1 is a sectional view showing a typical conventional MCM. In this conventional MCM, a silicon wiring board 10 having a wiring pattern is mounted in a recess portion formed in the center of the lower surface of an insulating board 7. A plurality of semiconductor chips 5 as bare chips are mounted on the silicon wiring board 10. The silicon wiring board 10 and the semiconductor chips 5 are connected to each other via thin metal lines 6 such as gold wires. The silicon wiring board 10 and the insulating board 7 are connected to each other via thin metal lines 6 such as gold wires.

External leads 3 extend vertically from the lower surface of the insulating board 7. The external leads 3 are connected to the semiconductor chips 5 via a wiring pattern formed on the insulating board 7. A cap 4 for covering the recess portion is brazed to the lower surface of the insulating board 7 with a gold solder or the like to seal the semiconductor chips 5. In addition, in order to efficiently dissipate heat generated by the semiconductor chips 5, a heat sink 16 is bonded to the opposite surface of the insulating board 7 to its semiconductor-chip-mounted surface with an adhesive 15 having a high thermal conductivity.

As a technique of realizing a packing density higher than that in the prior art in FIG. 1, an MCM having the structure shown in FIG. 2 has been proposed in Japanese Unexamined Patent Publication No. 3-64060. In this prior art, a multilayer printed circuit board 11 is inserted between a plurality of semiconductor chips 5 and a silicon wiring board 10. The multilayer printed circuit board 11 is formed by burying the semiconductor chips 5 having bump electrodes 13 in a resin such as a polyimide, alternately forming metal and insulating layers on the bump electrodes 13, and performing photoetching and the like for the resultant structure. Bump electrodes 12 are formed on the opposite surface of the multilayer printed circuit board 11 to its semiconductor-chip-mounted surface. The multilayer printed circuit board 11 is connected to the silicon wiring board 10 via the bump electrodes 12.

In general, in an MCM, as the number of semiconductor chips increases, the number of wiring layers between the semiconductor chips greatly increases. The prior art shown in FIG. 2 has been made in consideration of this problem. Since the wiring formation region of the structure in FIG. 2 is larger than that in the structure in FIG. 1, more semiconductor chips can be mounted.

In the above bare chip mounting technique, since a silicon wiring board and a multilayer printed circuit board are used, an MCM becomes expensive. In addition, replacement of a defective chip is much harder to perform and demands much more steps than replacement of a semiconductor device for surface mounting with a solder, which is generally used, although replacement of a defective chip can be performed. In addition, in replacing a defective chip, nondefective chips may be damaged.

Furthermore, in order to improve the yield after assembly, a current MCM of the bare chip mounting scheme is designed to mount only semiconductor chips whose qualities are guaranteed (so-called KGD: Known Good Die) after selection and burn-in. In general, however, selection and burn-in processes for bare chips are difficult to perform. This makes it difficult to supply or acquire bare chips, resulting in an increase in the manufacturing cost of the MCM.

As a means for solving the problem of "KGD" in the above bare chip mounting scheme, an MCM having the structure shown in FIG. 3 has been proposed. In this conventional MCM, a semiconductor chip 5 constituted by logic circuit elements, which generate heat in large quantities, such as a central processing unit (CPU) and a floating-point processing unit (FPU) is mounted in a recess portion in the lower surface of an insulating board 7 consisting of an alumina ceramic material and having a wiring pattern and external leads 3, and the wiring pattern of the insulating board 7 and the semiconductor chip 5 are connected to each other via thin metal lines 6 such as gold wires. Thereafter, a cap 4 is brazed to the recess portion with a gold solder or the like to seal the semiconductor chip 5. In this state, the semiconductor chip 5 undergoes selection and burn-in processes. Only when the chip is determined as a nondefective chip, the MCM is transferred to the subsequent steps.

A solder paste (not shown) is printed on the upper surface of the insulating board 7, which has been determined to be nondefective, and mold package semiconductor devices 8, e.g., memories, which generate heat in relatively small quantities, and whose qualities are guaranteed, and chip parts 9, e.g., chip resistors and chip capacitors, are mounted on the upper surface of the insulating board 7. In order to effectively dissipate heat generated by the semiconductor chip 5, a heat sink 16 is bonded to the opposite surface of the insulating board 7 to its semiconductor-chip-mounted surface with an adhesive 15 having a high thermal conductivity, as in the cases shown in FIGS. 1 and 2.

A technique of increasing a packing density by three-dimensionally mounting semiconductor chips has been proposed in Japanese Unexamined Utility Model Publication No. 2-45653 (FIG. 4). Mount lands and stitch lands are formed in a recess portion in a chip carrier 19 in FIG. 4. Side-surface electrodes 2 are formed on side surfaces of the chip carrier 19, and bump electrodes 12 are formed on the upper and lower major surfaces of the chip carrier 19. After semiconductor chips 5 are mounted on the mount lands of the chip carrier 19, the semiconductor chips 5 are connected to the stitch lands via thin metal lines 6 such as Gold wires. Thereafter, the surface of each semiconductor chip 5 is sealed by a seal resin 20.

These chip carriers 19 are stacked on each other, and the resultant structure is mounted on a board 21 having lands 22. The chip carriers are connected to each other via the bump electrodes 12 and the side-surface electrodes 2. In addition, the side-surface electrodes 2 are connected to the lands 22.

According to this prior art, since the semiconductor chips are vertically stacked on each other, high-density mounting can be realized as compared with a case wherein semiconductor chips are horizontally arranged. In addition, the wiring length can be decreased. Replacement of a defective chip is relatively easy because a general surface mounting technique using a solder is employed.

In the prior art shown in FIG. 3, a general surface mounting technique using a solder is employed, and packages and parts whose qualities are guaranteed are used. For this reason, the problems of difficulty in replacement of a defective chip and "KGD" in the bare chip mounting technique can be solved. In addition, the cost of this structure is lower than that of the structure using bare chips.

However, since the structure uses an insulating board consisting of a ceramic material or the like, some limitation is imposed on a wiring formation region. For this reason, high-density wiring is more difficult to perform than in the case wherein a silicon wiring board is used. In addition, mold package parts and chip parts, each having a larger size than a bare chip, are mounted on one surface of the insulating board. For this reason, as the number of parts to be mounted increases, the area of the insulating board increases, resulting in an increase in wiring length. Therefore, a signal delay time prolongs with an increase in stray capacitance. As the stray capacitance increases, the signal delay time prolongs, resulting in difficulty in a high-speed operation.

In order to solve this problem, the prior art shown in FIG. 4 may be used. In this prior art, however, since the chip carriers having the semiconductor chips sealed with a resin are stacked on each other, a problem is posed in terms of heat generated by each semiconductor chip. Even if semiconductor chips which generate heat in relatively small quantities are mounted on these chip carriers, since a plurality of chip carriers are tightly stacked on each other, the resultant structure does not allow heat to easily escape. For this reason, each semiconductor chip tends to operate erroneously. In addition, this structure is not suitable for mounting of high-performance semiconductor chips which generate heat in large quantities. Furthermore, if a semiconductor chip mounted on a chip carrier is a defective chip, this chip carrier itself must be discarded, and hence cannot be reused.

SUMMARY OF THE INVENTION

The present invention has been made in consideration of the above situation and, has as its object to provide an MCM which can prevent the problem of "KGD", can operate at a high speed, has excellent heat dissipation characteristics, and allows easy replacement of a defective part.

In order to achieve the above object, according to the basic aspect of the present invention, there is provided a multi-chip module comprising an insulating board which has a recess portion at a central portion of a lower surface and on which a wiring pattern is formed, a semiconductor chip mounted in the recess portion in the insulating board, a plurality of carriers, each mounted on an upper surface of the insulating board and having a leg portion with a side-surface electrode formed on a side surface, and a resin-sealed semiconductor device mounted on each carrier, wherein the resin-sealed semiconductor devices are mounted in a stacked state.

According to the MCM of the present invention, which has the above arrangement, since semiconductor devices are mounted on the insulating substrate in a stacked state, even if the number of semiconductor devices to be mounted increases, an increase in the area of the insulating board can be prevented. According to the present invention, therefore, an increase in wiring length can be prevented, and a decrease in operating speed can be suppressed.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

DETAILED DESCRIPTION OF THE PREFERRED EMBODIMENTS

Several preferred embodiments of the present invention will be described with reference to the accompanying drawings.

Figure 9:
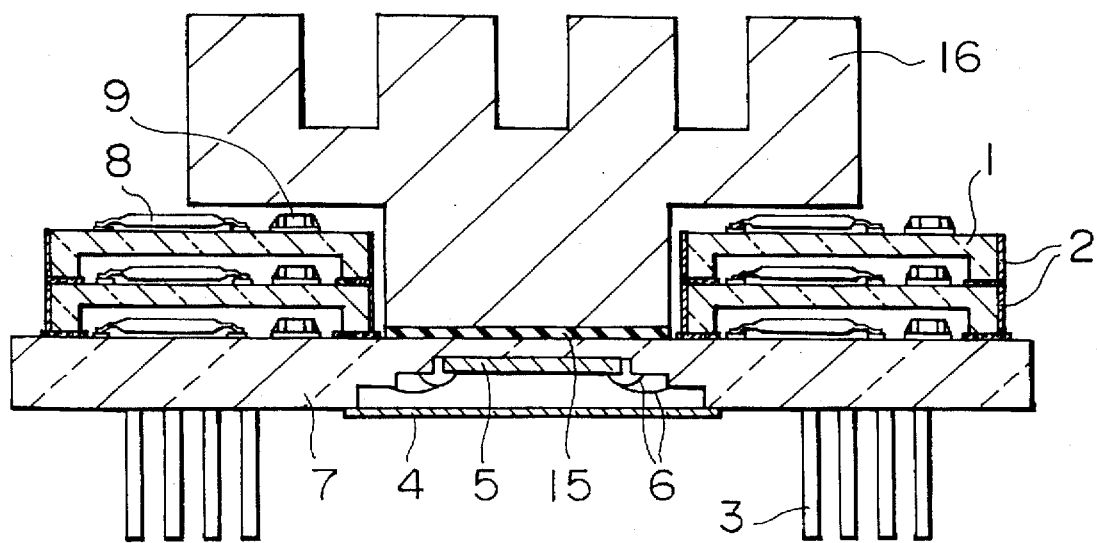
FIG. 9 is a sectional view of the first embodiment taken along line IX—IX of FIG. 5.
Figure 5:
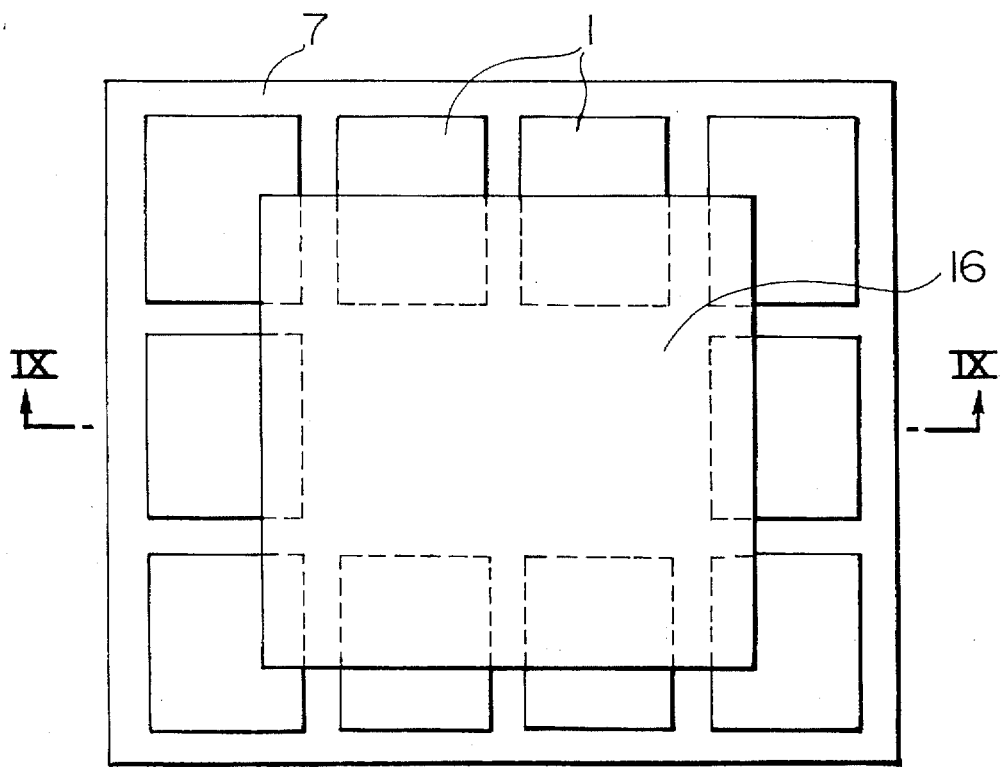
FIG. 5 is a plan view showing the first embodiment of the present invention.
Figure 6:
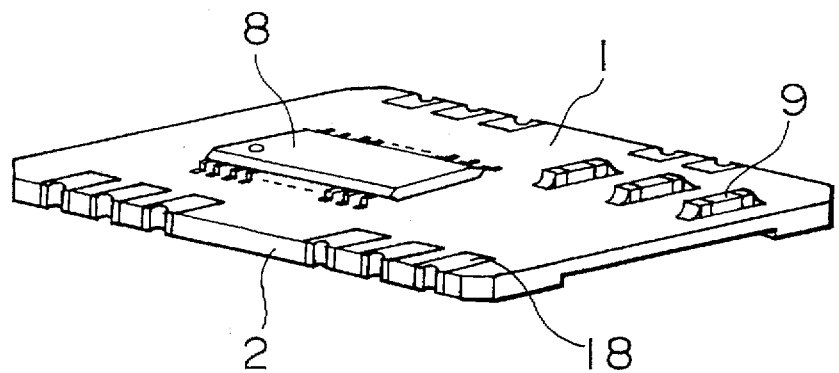
FIG. 6 is a perspective view showing a carrier having parts mounted thereon which is used in the first embodiment of the present invention.

FIGS. 5 and 9 show an MCM according to the first embodiment of the present invention. FIG. 5 is a plan view of the MCM. FIG. 9 is a sectional view taken along a line IX—IX in FIG. 5. FIG. 6 is a schematic perspective view showing one carrier mounted on the MCM of this embodiment.

A necessary wiring pattern is formed in advance on an insulating board 7 consisting of an alumina ceramic material, on which a semiconductor chip is to be mounted. External leads 3 connected to this wiring pattern extend vertically from the lower surface of the insulating board 7. A recess portion for mounting a semiconductor chip is formed in the lower surface of the insulating board 7. In the recess portion, a mount land and stitch lands are formed.

First of all, a semiconductor chip 5 constituted by logic circuit elements, which generate heat in large quantities, such as a central processing unit (CPU) and a floating-point processing unit (FPU) is mounted on the mount land, and the semiconductor chip 5 and the stitch lands are connected to each other via thin metal lines 6 such as gold wires. Thereafter, the semiconductor chip is sealed by a cap 4 with a solder such as a gold solder. The semiconductor chip 5 mounted on the insulating board 7 is then subjected to a selection process, and to a burn-in process, as needed. After this operation, only packages determined as nondefective parts are subjected to the next step.

A carrier 1 in FIG. 6 is mounted on the nondefective package. The carrier 1 is an insulating board consisting of an alumina ceramic material and having a recess portion in the lower surface. Side-surface electrodes 2 are formed on two side surfaces of the carrier 1. Pads 18 connected to the side-surface electrodes 2 are formed on peripheral portions of the board. A necessary wiring pattern (not shown) and pads (not shown) for a part mounting operation are formed on the upper surface of the carrier 1. A solder paste (not shown) is printed on the carrier 1, and a mold package semiconductor device 8 such as a memory and chip parts 9 such as chip capacitors are mounted on the carrier 1, as needed. In addition, another carrier 1 is stacked on this carrier 1. These stacked carriers 1 are processed by an infrared reflow apparatus. More specifically, the solder is melted by the apparatus, and the pads 18 on one carrier 1 are soldered to the side-surface electrodes 2 of the other carrier 1. At the same time, the semiconductor devices 8, the chip parts 9, and the like are soldered to the carriers 1.

Subsequently, a solder paste (not shown) is printed on the package determined as a nondefective product, on which the semiconductor chip 5 is mounted. The semiconductor devices 8 such as memories, the chip parts 9, and the above stacked carriers are mounted on the package altogether. The package on which these parts are mounted is processed by the infrared reflow apparatus to melt the solder. As a result, the mold package semiconductor devices 8, the chip parts 9, and the carriers 1 are simultaneously connected to the insulating board 7. Note that the solder reflow step upon stacking of the carriers 1 may be omitted, and the carriers 1 may be simultaneously soldered on the insulating board 7.

After this process, in order to effectively dissipate heat generated by the semiconductor chip 5, a heat sink 16 is bonded to the opposite surface of the insulating board 7 to its semiconductor-chip-mounted surface with an adhesive 15, as in the prior art.

Figure 1:
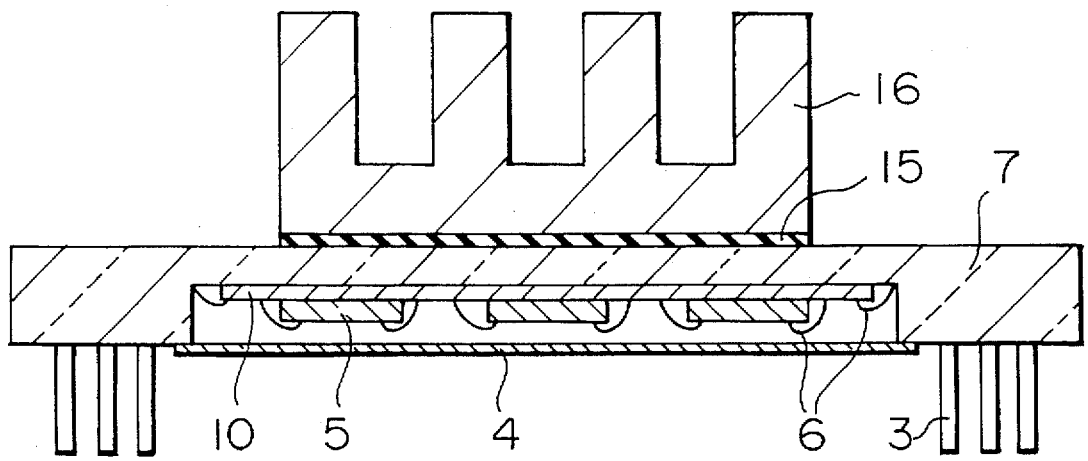
FIGS. 1, 2, and 3 are sectional views respectively showing first to third prior arts.
Figure 2:
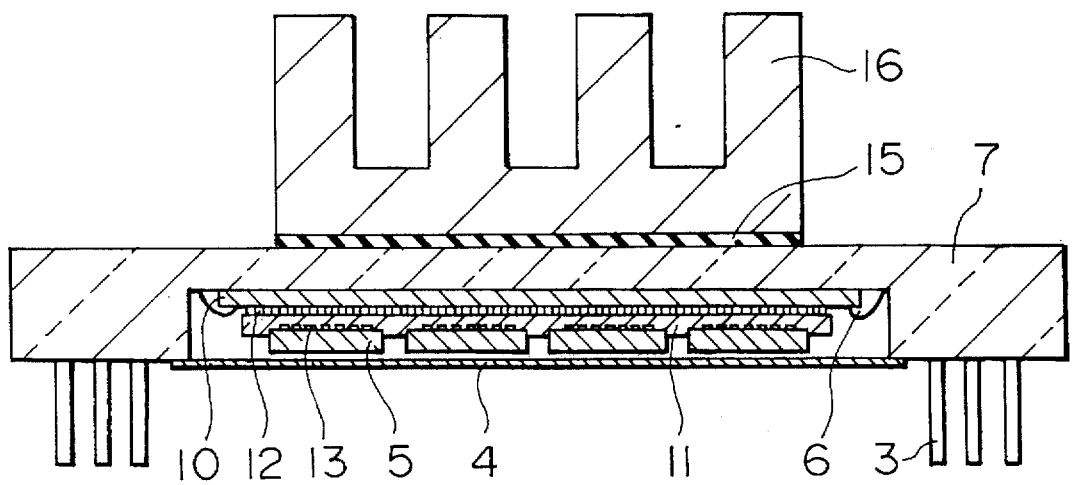
Figure 3:
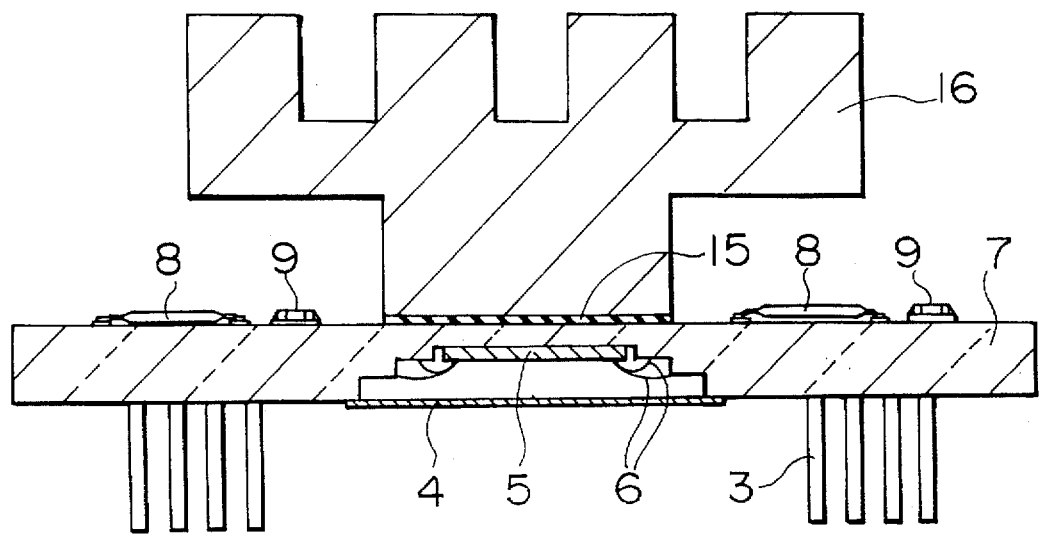
Figure 4:
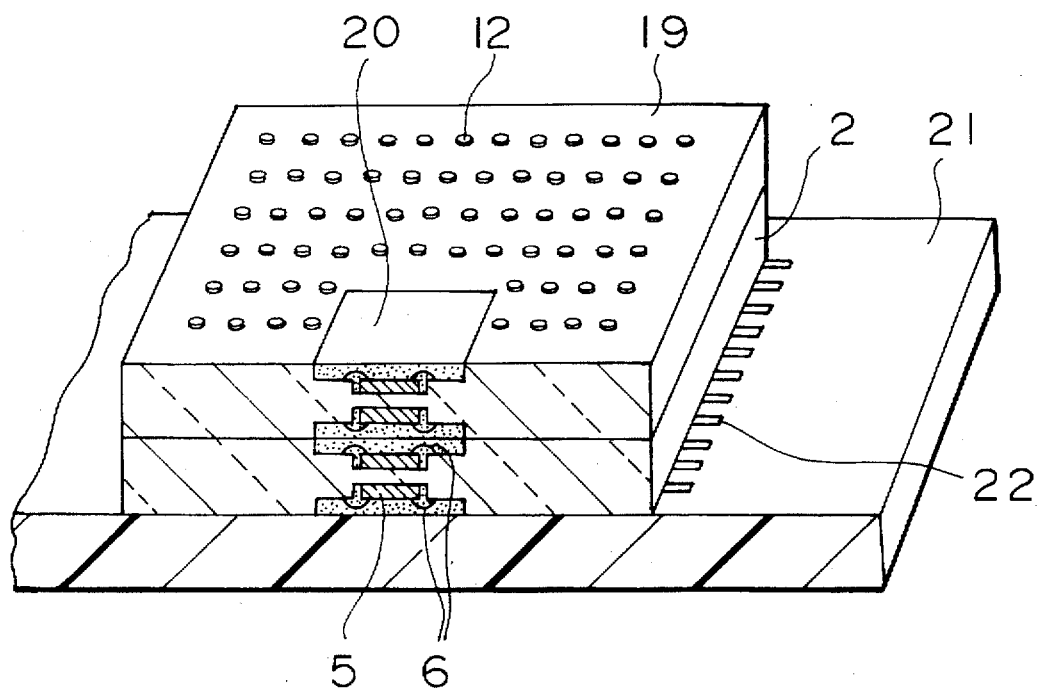
FIG. 4 is a schematic sectional view showing a fourth prior art.

With the above structure, mold package parts and chip parts three times larger in quantity than those mounted on the MCM in FIG. 3 can be mounted on the MCM of this embodiment. This MCM can prevent a great increase in wiring length, and hence can prevent an increase in signal delay time. In addition, by forming a wiring pattern on each carrier 1, congestion of wiring layers on the insulating board 7 can be reduced.

According to the carriers 1 in this embodiment, in order to prevent heat generated by the mounted parts from being confined in the carriers, leg portions are formed on two opposing side surfaces of the carrier 1, and the resultant recess portion is open to the two remaining side surfaces opposing each other. When cool air is passed through the space defined by this recess portion, an efficient cooling operation can be performed even in a multilayer structure constituted by a plurality of carriers. In addition, since the parts mounted on each carrier are connected with a solder, replacement of a defective part is facilitated, and the carrier can be reused.

Figure 7:
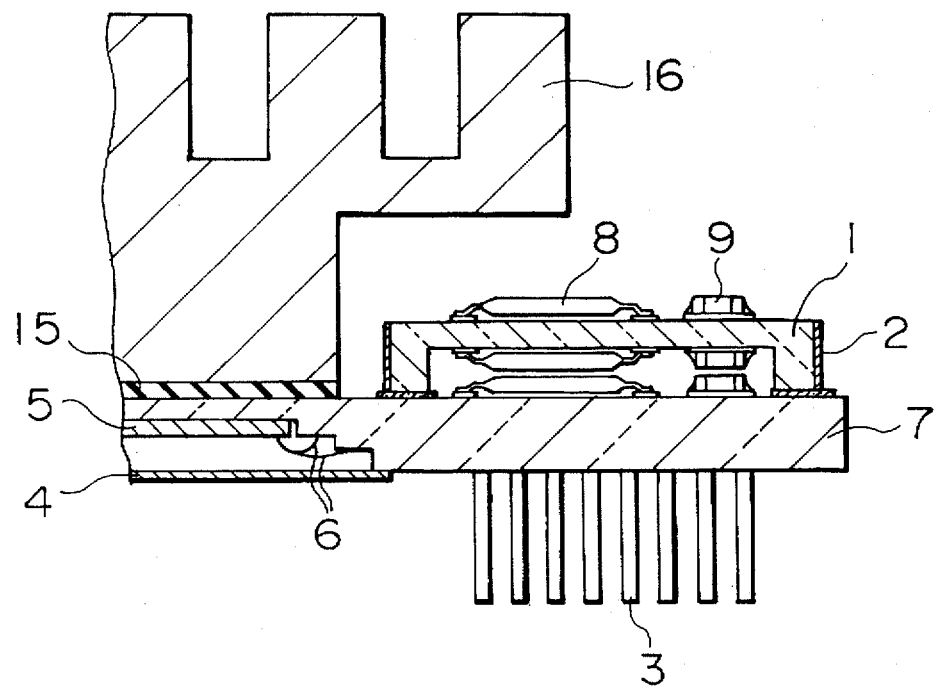
FIGS. 7 and 8 are sectional views respectively showing the second and third embodiments of the present invention.

The second embodiment of the present invention will be described next with reference to FIG. 7. FIG. 7 is a sectional view showing the main part of the second embodiment. The second embodiment is different from the first embodiment described above in that parts are mounted on the upper and lower surfaces of a carrier 1. This embodiment is manufactured as follows. First of all, a recess portion in the lower surface of the carrier 1 is coated with a solder paste. A semiconductor device 8 and a chip part 9 are then mounted in the recess portion. A soldering process is performed by an infrared reflow apparatus.

After this process, a solder paste is printed on the flat upper surface of the carrier 1, and a semiconductor device 8 and a chip part 9 are soldered to the upper surface by the same method as described in the first embodiment. As in the first embodiment, this carrier 1 is mounted on an insulating board 7, together with the semiconductor devices 8 and the chip parts 9. The carrier 1 is then soldered to the insulating board 7. In this embodiment as well, the parts other than the parts mounted in the recess portion of the carrier can be soldered at the same time the carrier is soldered onto the insulating board 7. In the embodiment, by mounting parts in the recess portion, more parts can be mounted by using a smaller quantity of carriers.

In this embodiment, in soldering parts mounted in the recess portion of the carrier 1, a solder having a higher melting temperature than a solder used to solder the remaining parts must be used.

Figure 8:
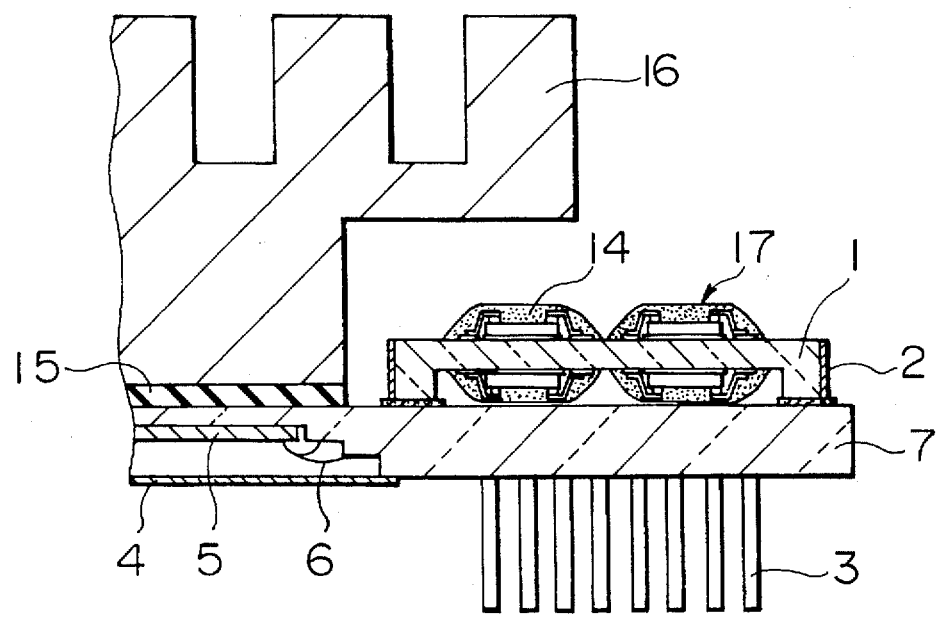

The third embodiment of the present invention will be described next with reference to FIG. 8. FIG. 8 is a sectional view showing the main part of the third embodiment.

The third embodiment is different from the first and second embodiments in that parts mounted on a carrier 1 are TAB-mounted semiconductor chips 17. In addition, in this embodiment, electronic parts are not directly soldered onto an insulating board 7.

In this embodiment, in mounting chips on the carrier 1, semiconductor chips on a TAB tape are mounted on the upper and lower surfaces of the carrier 1 via mount members. The outer leads of each TAB tape portion are bonded to the carrier 1 by OLB (Outer Lead Bonding) using an ultrasonic single point bonding method. Thereafter, the resultant structure is sealed with a seal resin 14.

Subsequently, as in the first embodiment, a solder reflow process is performed to mount the above carrier 1 on a package determined as a nondefective product upon selection of a semiconductor chip 5 mounted on the insulating board 7. The TAB-mounted semiconductor chips 17 mounted on this carrier have undergone a selection process, and a burn-in process, as needed, when the chips were mounted on the TAB tape. For this reason, in this embodiment as well, the problem of "KGD" is not posed. In addition, a semiconductor device obtained by sealing a TAB-mounted semiconductor chip with a resin by a potting method is smaller in size than a mold package. For this reason, more semiconductor chips than those mounted in the second embodiment can be mounted. In addition, replacement of a defective chip can be performed by replacing a defective carrier alone without adversely affecting the remaining nondefective parts such as the semiconductor chip 5. Furthermore, if a material having a high thermal conductivity is used for a carrier, a semiconductor chip can be effectively cooled.

The preferred embodiments have been described above. However, the present invention is not limited these embodiments, and various modifications and changes can be made without departing the spirit and scope of the invention. For example, the number of carriers to be stacked and the method of stacking them may be different from those in the above embodiments. In each embodiment, an alumina ceramic material is used for each insulating board and each carrier. However, aluminum nitride having a higher thermal conductivity can be used when semiconductor chips, mold package semiconductor devices, and the like generate heat in large quantities.

In addition, since the structure of this carrier allows cool air to pass therethrough, heat generated by the parts, the semiconductor devices, and the like mounted on the carrier can be dissipated more effectively than in the prior art. Furthermore, a defective part, a defective semiconductor device, or the like mounted on the carrier can be replaced more easily than in the prior art.

What is claimed is:

1. A multi-chip module comprising an insulating board which has a recess portion formed in a central portion of a lower surface and on which a wiring pattern is formed, a semiconductor chip mounted in the recess portion in said insulating board, a plurality of carriers, each mounted on an upper surface of said insulating board and having a leg portion with a side-surface electrode formed on a side surface, and a semiconductor device with accessible leads mounted on each carrier, wherein said carriers are mounted atop one another at least two carriers deep without any separate connection device.

2. A module according to claim 1, further comprising a plurality of external leads extending vertically from an outer peripheral portion of the recess portion formed in the center of the lower surface of said insulating board.

3. A module according to claim 1, further comprising a heat sink mounted on a central portion on the upper surface of said insulating board, and wherein said carriers are mounted around said heat sink.

4. A module according to claim 1, further comprising a semiconductor device with accessible leads directly mounted on the upper surface of said insulating board below at least one of the carriers.

5. A module according to claim 1, further comprising semiconductor devices with accessible leads mounted on the upper and lower surfaces of said carriers.

6. A module according to claim 1, wherein each of said carriers has two leg portions formed along two opposing sides, and a recess portion defined by the leg portions is open to two remaining side surfaces opposing each other.

7. A module according to claim 6, wherein cool air is passed through the recess portion of the carrier.

8. A module according to claim 1, wherein said semiconductor device mounted on said carriers is a TAB-mounted semiconductor chip.

9. A module according to claim 1, wherein said carriers, said semiconductor devices, and remaining parts are simultaneously connected to said insulating board with solder.

10. A multi-chip module comprising:

an insulating board having a recess portion formed in a central portion of a lower surface and on which a wiring pattern is formed;

a semiconductor chip mounted in the recess portion;

a plurality of carriers, each comprising a top and a bottom surface and two leg portions extending downward from the bottom surface; a plurality of electrodes formed on an outer surface of at least one of the leg portions; pads electrically connected to the electrodes disposed upon a peripheral area of the top surface and a base of at least one of the leg portions; and a space between the leg portions being open to allow airflow therethrough; and at least one semiconductor device electrically connected to the top surface of each of the plurality of carriers;

wherein at least one first level carrier is directly attached and electrically connected to an upper surface of the insulating board through the pads on the carrier's base; at least one first level carrier is further attached to a second level carrier via the pads disposed on the top surface of the first level carrier and the pads disposed on the base of the second level carrier, without any separate connection device.

11. The multi-chip module of claim 10, wherein leads connecting each semiconductor device to the carrier to which it is attached are accessible from above the semiconductor device after it has been connected to the carrier.

12. The multi-chip module of claim 11, wherein each of the carriers with its connected at least one semiconductor device is testable by contacting the leads of the at least one semiconductor device.

13. The multi-chip module of claim 12, further comprising at least one additional level of carrier with attached at least one semiconductor device, each additional level of carrier being attached to a previously attached carrier via the pads on the top surface of the previously attached carrier and the pads on the base of the additional level carrier.

14. The multi-chip module of claim 13, further comprising a heat sink attached to an central portion of the upper surface of the insulating board, the carriers being attached around the heat sink.

15. The multi-chip module of claim 10, further comprising at least one additional level of carrier with attached at least one semiconductor device, each additional level of carrier being attached to a previously attached carrier via the pads on the top surface of the previously attached carrier and the pads on the base of the additional level carrier.

16. The multi-chip module of claim 10, further comprising at least one semiconductor device electrically connected to the bottom surface of at least one of the plurality of carriers.

17. The multi-chip module of claim 16, wherein leads connecting each semiconductor device to the carrier to which it is attached are accessible from above the semiconductor device after it has been connected to the carrier.

18. The multi-chip module of claim 17, wherein each of the carriers with its connected at least one semiconductor device is testable by contacting the leads of the at least one semiconductor device.

19. The multi-chip module of claim 18, further comprising at least one additional level of carrier with attached at least one semiconductor device, each additional level of carrier being attached to a previously attached carrier via the pads on the top surface of the previously attached carrier and the pads on the base of the additional level carrier.

20. The multi-chip module of claim 19, further comprising a heat sink attached to an central portion of the upper surface of the insulating board, the carriers being attached around the heat sink.

* * * * *